United States Patent
Röhrer (10) Patent No.: US 9,349,943 B2
(45) Date of Patent: May 24, 2016

(54) HALL SENSOR SEMICONDUCTOR COMPONENT AND METHOD FOR OPERATING THE HALL SENSOR SEMICONDUCTOR COMPONENT

(75) Inventor: Georg Röhrer, Lebring (AT)

(73) Assignee: ams AG, Unterpremstaetten (AT)

( * ) Notice: Subject to any disclaimer, the term of this patent is extended or adjusted under 35 U.S.C. 154(b) by 170 days.

(21) Appl. No.: 14/111,537

(22) PCT Filed: Apr. 11, 2012

(86) PCT No.: PCT/EP2012/056567
§ 371 (c)(1),
(2), (4) Date: Jan. 14, 2014

(87) PCT Pub. No.: WO2012/140074
PCT Pub. Date: Oct. 18, 2012

(65) Prior Publication Data
US 2014/0117983 A1    May 1, 2014

(30) Foreign Application Priority Data

Apr. 14, 2011    (DE) .......................... 10 2011 017 096

(51) Int. Cl.
*G01R 33/06*    (2006.01)
*G01R 33/07*    (2006.01)
(Continued)

(52) U.S. Cl.
CPC ............ *H01L 43/065* (2013.01); *G01R 33/075* (2013.01)

(58) Field of Classification Search
CPC .. G01R 33/07; G01R 15/202; G01R 33/0094; G01R 21/08; G01R 33/0005; G01R 33/06; G01R 33/1215; H01L 43/065; G01D 5/142

USPC .................. 324/251, 225, 207.2, 117 H, 247
See application file for complete search history.

(56) References Cited

U.S. PATENT DOCUMENTS

| 5,406,202 | A | 4/1995 | Mehrgardt et al. |
| 6,064,202 | A | 5/2000 | Steiner et al. |
| 6,768,301 | B1 * | 7/2004 | Hohe ................. G01R 33/0094 324/251 |

(Continued)

FOREIGN PATENT DOCUMENTS

| DE | 1194971 B | 6/1965 |
| DE | 19943128 A1 | 4/2001 |

(Continued)

OTHER PUBLICATIONS

Hebard et al., "A Chopper Stabilized Biasing Circuit Suitable for Cascaded Wheatstone-Bridge-Like Sensors", IEEE Transactions on Circuits and Systems—I: Regular Papers, vol. 52, No. 8, Aug. 2005, pp. 1653-1665.

(Continued)

*Primary Examiner* — Tung X Nguyen
*Assistant Examiner* — Neel Shah
(74) *Attorney, Agent, or Firm* — McDermott Will & Emery LLP (57) ABSTRACT

The Hall sensor semiconductor component comprises an arrangement of at least two Hall sensors (1, 2) with signal connections (11, 13, 21, 23) and supply connections (12, 14, 22, 24), and a switching network, which varies the positions of the supply connections in successive phases and connects the Hall sensors in series in each phase via the respective signal connections.

13 Claims, 9 Drawing Sheets

(51) Int. Cl.
*G01R 21/08* (2006.01)
*H01L 43/06* (2006.01)

(56) References Cited

U.S. PATENT DOCUMENTS

| | | | |
|---|---|---|---|
| 7,345,476 B2 * | 3/2008 | Middelhoek | G01R 33/07 324/251 |
| 7,375,507 B2 | 5/2008 | Racz et al. | |
| 2002/0135358 A1 | 9/2002 | Sager et al. | |
| 2003/0155912 A1 * | 8/2003 | Motz | G01R 33/07 324/225 |
| 2009/0315549 A1 * | 12/2009 | Hackner | G01R 33/07 324/251 |
| 2012/0016614 A1 | 1/2012 | Hohe et al. | |
| 2012/0169329 A1 | 7/2012 | Hellwig et al. | |

FOREIGN PATENT DOCUMENTS

| | | |
|---|---|---|
| DE | 10 2006 037 226 A1 | 2/2008 |
| DE | 10 2009 027 338 A1 | 1/2011 |
| EP | 0 667 648 A2 | 8/1995 |
| EP | 1 206 707 A1 | 5/2002 |
| EP | 1 772 737 A2 | 4/2007 |
| EP | 2 068 163 A2 | 6/2009 |
| EP | 2 194 390 A2 | 6/2010 |
| JP | S58154263 A | 9/1983 |
| JP | H06164015 A | 6/1994 |
| WO | 01/18556 A1 | 3/2001 |
| WO | 2005/017546 A1 | 2/2005 |
| WO | 2005/073744 A1 | 8/2005 |

OTHER PUBLICATIONS

Kammerer et al., "Horizontal Hall Effect Sensor With High Maximum Absolute Sensitivity", IEEE Sensors Journal, vol. 3, No. 6, Dec. 2003, pp. 700-707.

Popovic, R., "Hall Effect Devices", Second Edition, Institute of Physics Publishing, 2004, pp. 240-289.

Popovic, R., "A MOS Hall Device Free From Short-Circuit Effect", Sensors and Actuators, vol. 5, 1984, pp. 253-262.

* cited by examiner

HALL SENSOR SEMICONDUCTOR COMPONENT AND METHOD FOR OPERATING THE HALL SENSOR SEMICONDUCTOR COMPONENT

The present invention relates to a Hall sensor semiconductor component having high sensitivity in conjunction with a low offset voltage, and to an adapted operating method.

The Hall effect, named after the American physicist Edwin Herbert Hall (1855-1938), occurs when a magnetic field is present perpendicular to an electric current. In this case, the magnetic field generates a potential difference, designated as the Hall voltage, in a direction running both perpendicular to the direction of the magnetic field and perpendicular to the direction of the current. A measurement of the Hall voltage makes it possible to determine the magnitude of the relevant component of the magnetic field.

A Hall sensor provided for measuring a Hall voltage can be realized as a semiconductor component. An evaluation circuit can also be integrated in the semiconductor component, which evaluation circuit can be produced for example in the context of a CMOS process. If the plane of the active region, in which the operating current flows and the Hall voltage occurs, is arranged in a manner coplanar with respect to the top side of the semiconductor body, it is possible to measure a Hall voltage brought about by a magnetic field component directed perpendicular to the top side. If the plane of the active region is arranged perpendicular to the top side, that is to say vertically within the semiconductor body, it is possible to measure a Hall voltage brought about by a magnetic field component directed parallel to the top side.

In Hall sensor semiconductor components, the achievable sensitivity is limited by the mobility of the charge carriers in the semiconductor material used. In silicon, the maximum sensitivity of a Hall sensor, measured by the magnitude of the Hall voltage relative to the strength of the magnetic field and the operating voltage, is approximately 0.1/T. Other semiconductor materials offer a high charge carrier mobility, but are less suited to integration of the Hall sensor with the driving and evaluation electronics.

In the textbook by R. S. Popovic, "Hall Effect Devices", second edition, Institute of Physics Publishing, Bristol and Philadelphia 2004, the temperature dependence of the sensitivity is discussed in section 5.1.4 on pages 241 and 242. Vertical Hall components are described on pages 261 to 264. Pages 280 to 289 describe a series of methods by which the temperature variation is compensated for, the offset voltage is reduced and frequency-dependent noise is suppressed. These also include the method of spinning operating currents (spinning current technique).

Further methods for improving the operating properties of Hall sensors are described in the publications by R. S. Popovic: "A MOS Hall device free from short-circuit effect", Sensors and Actuators A5, 253-262 (1984), J.-B. Kammerer et al.: "Horizontal Hall Effect Sensor with High Maximum Absolute Sensitivity", IEEE Sensors Journal 3 (2003), L. Hébrard et al.: "A Chopper Stabilized Biasing Circuit Suitable for Cascaded Wheatstone-Bridge-Like Sensors", IEEE Transactions on Circuits and Systems 52 (2005), and in EP 0 667 648 A2, WO 2005/017546 A1, WO 2005/073744 A1, U.S. Pat. No. 6,064,202 A, WO 01/18556 A1 and EP 2 068 163 A2.

It is an object of the present invention to specify a Hall sensor semiconductor component having high sensitivity and a low offset voltage.

This object is achieved by means of the Hall sensor semiconductor component comprising the features of claim 1. Configurations, in particular associated operating methods, are evident from the dependent claims.

The Hall sensor semiconductor component comprises an arrangement composed of at least two Hall sensors provided with electrical terminals that are switchable separately from one another. The so-called voltage terminals used for a measurement of a Hall voltage, which voltage terminals are intended to be designated here as signal terminals, are connected in series, and the Hall voltage brought about when a magnetic field occurs is tapped off at the outer terminals of said series circuit. The so-called current terminals provided for applying the operating currents or operating voltages, which current terminals are intended to be designated here as supply terminals, and the series circuit formed by the signal terminals are changed phase by phase by changeover of the terminal connections. This takes place in the manner of the method of spinning operating currents (spinning current technique) known per se for individual Hall sensors, this method being suitably modified for the mode of operation of this Hall sensor semiconductor component. A switching network is provided for this purpose. The operating currents of the individual Hall sensors preferably have different directions, and these directions can form different angles depending on the configuration of the Hall sensor semiconductor component.

The Hall sensor semiconductor component comprises an arrangement composed of at least two Hall sensors having signal terminals and supply terminals, and also a switching network, which in successive phases varies the positions of the supply terminals and connects the Hall sensors in series via the respective signal terminals in each phase.

In an embodiment of the Hall sensor semiconductor component, the Hall sensors are arranged in a semiconductor body having a top side and are oriented such that a magnetic field component parallel to the top side is measured. The Hall sensors are embodied in particular as vertical Hall sensors in the semiconductor body.

In a further embodiment of the Hall sensor semiconductor component, an electronic circuit is provided, said electronic circuit providing current sources and current sinks Mutually separate connections are provided for connecting the current sources and current sinks to the supply terminals.

In a further embodiment of the Hall sensor semiconductor component, the supply terminals of the Hall sensors are provided for an inflow and an outflow of operating currents, and the switching network connects the supply terminals provided for the inflow and/or the supply terminals provided for the outflow to one another in each phase.

In a further embodiment of the Hall sensor semiconductor component, at least one of the Hall sensors consists of a hardwired circuit formed by a plurality of individual Hall sensors.

In a further embodiment of the Hall sensor semiconductor component, the supply terminals of the Hall sensors are arranged such that directions of the operating currents can also form angles of 45°, 135°, 225° and/or 315°.

In a method for operating the Hall sensor semiconductor component, the supply terminals of the Hall sensors are switched in each of the phases such that the directions of the operating currents flowing through the supply terminals vary between the Hall sensors succeeding one another in accordance with the series circuit.

In one embodiment of the operating method, an even number of Hall sensors is used, and the supply terminals of the Hall sensors are switched in each of the phases such that the directions of the operating currents within two groups comprising the same number of Hall sensors form angles of 90°, 180° and/or 270° among one another, and the directions of the operating currents of two Hall sensors belonging to different ones of said groups in each case form an angle of 45°, 135°, 225° or 315°.

In a further embodiment of the operating method, with respect to each phase an earlier or a later phase takes place, in which the current terminals are subjected to polarity reversal, such that the direction of the operating current is reversed in each Hall sensor.

In a further embodiment of the operating method, the Hall sensors within the series circuit are permuted from phase to phase.

In a further embodiment of the operating method, current sources and current sinks are provided for the operating currents, and the phases are repeated with permuted current sources and current sinks.

Examples of the Hall sensor semiconductor component and of the operating methods are described in greater detail below with reference to the accompanying figures.

FIGS. 1 to 4 schematically show arrangements composed of two Hall sensors 1, 2, which are connected in series by means of electrically conductive connections 10, for successive phases of an operating method. The Hall sensors 1, 2 each have four terminals 11, 12, 13, 14, 21, 22, 23, 24, of which in each operating phase two terminals are connected as supply terminals 12, 14, 22, 24 for the operating currents I1/I1', I2/I2' and two terminals are connected as signal terminals 11, 13, 21, 23 for tapping off a signal, in particular a Hall voltage V1/V1', V2/V2' that occurs. In this embodiment, current sources I1, I2 and current sinks I1', I2' are provided for the operating currents I1/I1', I2/I2', said current sources and current sinks being provided by an electronic circuit. The differing notation In and In', respectively, is intended to indicate that a small mismatch of the current sources I1, I2 and current sinks I1', I2' associated with the same operating current I1/I1', I2/I2' can possibly occur owing to the circuitry.

In the embodiment illustrated in FIGS. 1 to 4, the Hall sensors 1, 2 are symmetrical with respect to a rotation by 90°. The four terminals 11, 12, 13, 14 and 21, 22, 23, 24 are correspondingly arranged in directions rotated by 90° with respect to one another. At least one of the Hall sensors 1, 2 can consist of a hardwired circuit formed by a plurality of individual Hall sensors. In embodiments, the Hall sensors 1, 2 can be formed in particular in each case by two or more separate Hall sensors connected in parallel with one another, such that the signal terminals and the supply terminals of the parallel-connected Hall sensors are spatially rotated relative to one another in each phase.

A first signal terminal 11 of the first Hall sensor 1 and a second signal terminal 23 of the second Hall sensor 2 are situated at the ends of the series circuit formed by the Hall sensors 1 and 2 and are provided for tapping off a summation signal, in particular the Hall voltages V1/V1', V2/V2' connected in series. The second signal terminal 13 of the first Hall sensor 1 is connected to the first signal terminal 21 of the second Hall sensor 2.

During operation, an operating current I1/I1', I2/I2' flows through each Hall sensor 1, 2 of the arrangement. The directions of the operating currents I1/I1', I2/I2' are indicated by arrows within the contours representing the Hall sensors 1, 2 in FIGS. 1 to 4. The directions of the operating currents I1/I1', I2/I2' in each case form an angle different from zero with respect to one another. In the example shown in FIGS. 1 to 4, said angle between the directions of the operating currents I1/I1', I2/I2' is 90° in each case. However, other angles can also be provided. It may be advantageous to repeat the phases with permuted current sources I1, I2 and current sinks I1', I2', as a result of which, in particular, a mismatch of the current sources I1, I2 to the current sinks I1', I2' that is present can be at least partly compensated for.

Figure 1:
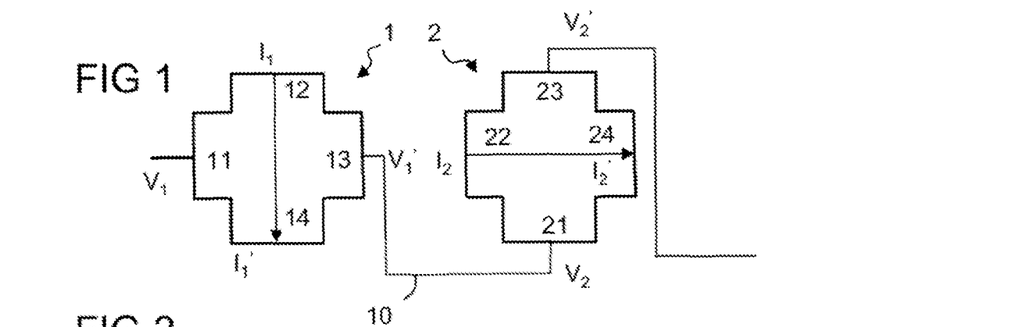
FIG. 1 shows a schematic illustration of an arrangement composed of two Hall sensors.
Figure 2:
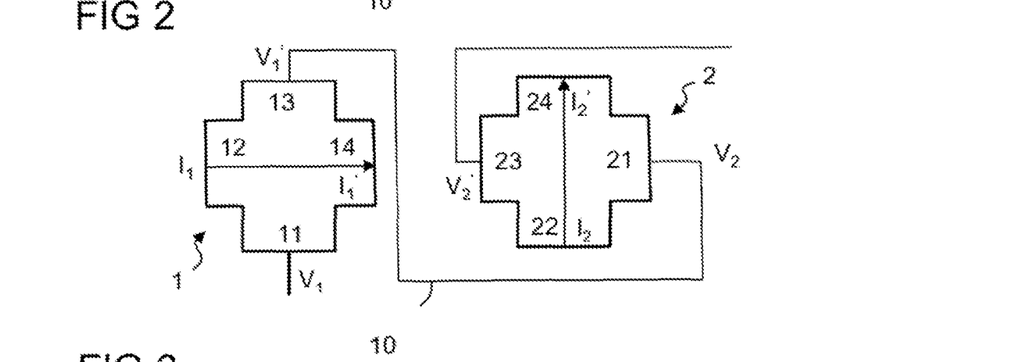
FIG. 2 shows the arrangement in accordance with FIG. 1 for a subsequent circuit phase.
Figure 3:
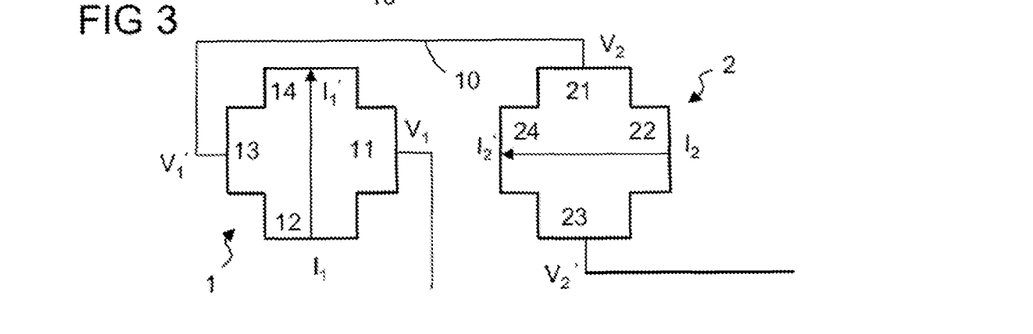
FIG. 3 shows the arrangement in accordance with FIG. 2 for a subsequent circuit phase.
Figure 4:
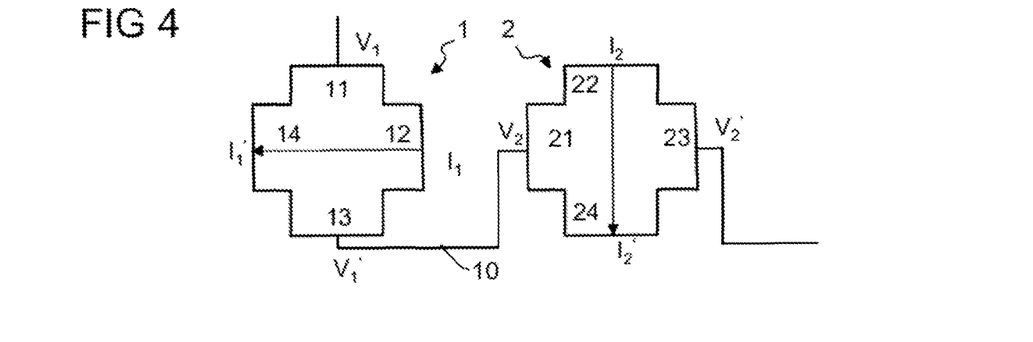
FIG. 4 shows the arrangement in accordance with FIG. 3 for a subsequent circuit phase.

The circuit of the arrangement is shown for a first phase in FIG. 1, for a second phase following the first phase in FIG. 2, for a third phase following the second phase in FIG. 3, and for a fourth phase following the third phase in FIG. 4. In the phases, the directions of the operating currents I1/I1', I2/I2' are rotated by 90° in a mathematically positive direction of rotation in comparison with the respectively preceding phase. A measurement can be concluded after two phases, for example in accordance with FIGS. 1 and 2 or in accordance with FIGS. 2 and 3. However, a measurement can also encompass all of the phases shown. Measurements with two phases can be carried out more rapidly than measurements with four phases, which, however, yield better results under certain circumstances. Measurements with two or four phases are preferred over measurements with three phases. For the purpose of a further measurement, the phases can be repeated cyclically. Instead, the sequence of the phases can change from measurement to measurement.

The signal terminals 11, 13, 21, 23 are connected in each phase in such a way that the signals, in particular Hall voltages V1/V1', V2/V2' occurring in the Hall sensors 1, 2 are added and a summation signal, in particular a correspondingly high total Hall voltage V1/V2', can be measured at the outer signal terminals 11, 23 of the series circuit. That means that upon passing through the connections 10 forming the series circuit from the first signal terminal 11 of the first Hall sensor 1 to the second signal terminal 23 of the second Hall sensor 2, the arrows of the operating currents I1/I1', I2/I2' are traversed in the same direction, in the example shown in the viewing direction toward the arrow tip in each case from right to left, with the result that the individual Hall voltages in the series circuit are added. The measurement signal can be a voltage or a current.

FIGS. 5 to 8 schematically show arrangements composed of four Hall sensors 1, 2, 3, 4, which are connected in series by means of electrically conductive connections 10, for successive phases of an operating method. The circuit of the first two Hall sensors 1, 2 corresponds to one of FIGS. 1 to 4 in each phase. Like the first Hall sensor 1 and the second Hall sensor 2, the third Hall sensor 3 and the fourth Hall sensor 4 each have four terminals 31, 32, 33, 34 and 41, 42, 43, 44, respectively, of which in each operating phase two terminals are connected as supply terminals 32, 34, 42, 44 for the operating currents I3/I3', I4/I4' and two terminals are connected as signal terminals 31, 33, 41, 43 for tapping off a signal, in particular a Hall voltage V3/V3', V4/V4' that occurs. In this embodiment, too, current sources I1, I2, I3, I4, and current sinks I1', I2', I3', I4' are provided for the operating currents I1, I1', I2/I2', I3/I3', I4/I4', said current sources and current sinks being provided by an electronic circuit.

In the embodiment illustrated in FIGS. 5 to 8, the Hall sensors 1, 2, 3, 4 are symmetrical with respect to a rotation by 90°. The four terminals 11, 12, 13, 14, 21, 22, 23, 24, 31, 32, 33, 34, 41, 42, 43, 44 are correspondingly arranged in directions rotated by 90° with respect to one another. In embodiments, the Hall sensors 1, 2, 3, 4 can be formed in particular in each case by two or more separate Hall sensors connected in parallel with one another, such that the signal terminals and the supply terminals of the parallel-connected Hall sensors are spatially rotated relative to one another in each phase.

A first signal terminal 11 of the first Hall sensor 1 and a second signal terminal 43 of the fourth Hall sensor 4 are situated at the ends of the series circuit formed by the Hall sensors 1, 2, 3, 4 and are provided for tapping off a signal, in particular the series-connected Hall voltages V1/V1', V2/V2', V3/V3', V4/V4'. The second signal terminal 13 of the first Hall sensor 1 is connected to the first signal terminal 21 of the second Hall sensor 2. The second signal terminal 23 of the second Hall sensor 2 is connected to the first signal terminal 31 of the third Hall sensor 3. The second signal terminal 33 of the third Hall sensor 3 is connected to the first signal terminal 41 of the fourth Hall sensor 4.

During operation, an operating current I1/I1', I2/I2', I3/I3', I4/I4' flows through each Hall sensor 1, 2, 3, 4 of the arrangement. The directions of the operating currents I1/I1', I2/I2', I3/I3', I4/I4' are indicated by arrows within the contours representing the Hall sensors 1, 2, 3, 4 in FIGS. 5 to 8. The directions of the operating currents I1/I1', I2/I2', I3/I3', I4/I4' form in each case an angle different from zero with respect to one another. In the example shown in FIGS. 5 to 8, said angle between the directions of the operating currents I1/I1', I2/I2', I3/I3', I4/I4' is 90° in each case. However, other angles can also be provided, and the direction of rotation can be opposite or else change, for example alternately.

Figure 5:
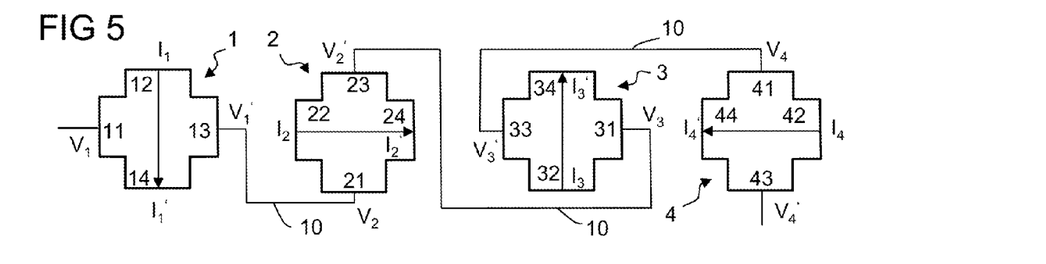
FIG. 5 shows a schematic illustration of an arrangement composed of four Hall sensors.
Figure 6:
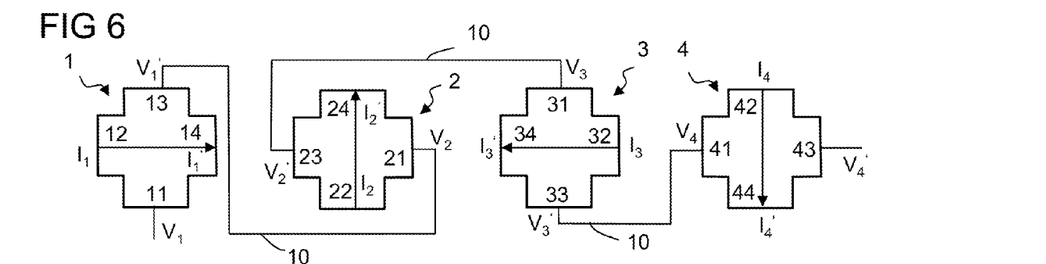
FIG. 6 shows the arrangement in accordance with FIG. 5 for a subsequent circuit phase.
Figure 7:
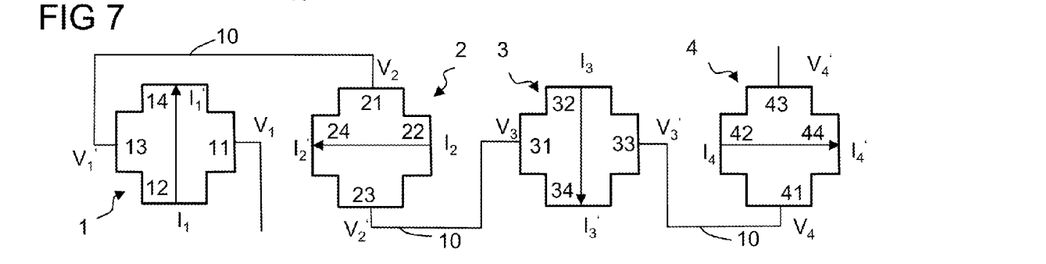
FIG. 7 shows the arrangement in accordance with FIG. 6 for a subsequent circuit phase.
Figure 8:
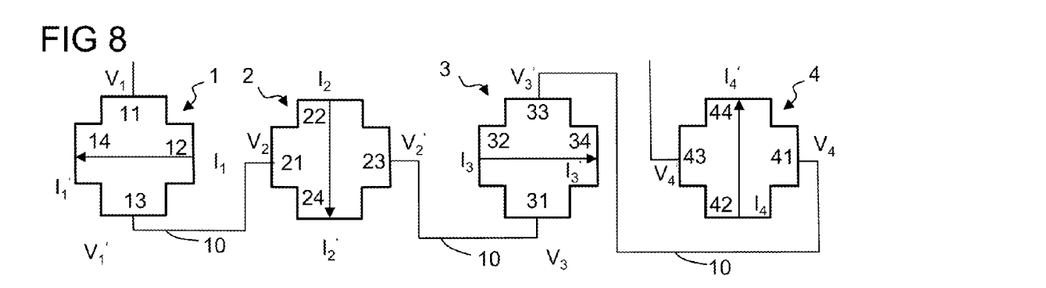
FIG. 8 shows the arrangement in accordance with FIG. 7 for a subsequent circuit phase.

The circuit of the arrangement is shown for a first phase in FIG. 5, for a second phase following the first phase in FIG. 6, for a third phase following the second phase in FIG. 7, and for a fourth phase following the third phase in FIG. 8. In the phases, the directions of the operating currents I1/I1', I2/I2', I3/I3', I4/I4' are rotated by 90° in a mathematically positive direction of rotation in comparison with the respectively preceding phase. It can be advantageous to repeat the phases with permuted current sources I1, I2, I3, I4 and current sinks I1', I2', I3', I4', as a result of which, in particular, a mismatch of the current sources I1, I2, I3, I4 to the current sinks I1', I2', I3', I4' that is present can be at least partly compensated for.

The signal terminals 11, 13, 21, 23, 31, 33, 41, 43 are connected in each phase in such a way that the signals, in particular Hall voltages V1/V1', V2/V2', V3/V3', V4/V4', occurring in the Hall sensors 1, 2, 3, 4 are added and a summation signal, in particular a correspondingly high total Hall voltage V1/V4', can be measured at the outer signal terminals 11, 43 of the series circuit. A measurement can be concluded after two phases, for example in accordance with FIGS. 5 and 6 or in accordance with FIGS. 6 and 7. However, a measurement can also encompass all of the phases shown. In this embodiment, too, measurements with two or four phases are preferred in comparison with measurements with three phases. For the purpose of a further measurement, the phases can be cyclically repeated. Instead, the sequence of the phases can change from measurement to measurement. If each Hall sensor 1, 2, 3, 4 of the arrangement is provided with eight terminals, the method can advantageously also be carried out with eight phases of different interconnections per measurement.

The positions of the Hall sensors 1, 2, 3, 4 within the series circuits can vary, such that, for example, a Hall sensor used as first Hall sensor in one phase is used as second Hall sensor or further back in the series circuit in the subsequent phase. In particular, the outer signal terminals of the series circuits at which the total Hall voltage that occurs is tapped off can belong to different Hall sensors in different phases. The different circuit of the terminals in the different phases therefore need not be restricted to varying only the directions of the operating currents; additionally or instead, the Hall sensors can be permuted from phase to phase within the series circuit. There are no restrictions for the variations—possible in different phases—of the positions occupied by the Hall sensors within the series circuit.

As many Hall sensors as desired can be provided in the arrangement. In the schematic diagram in FIGS. 5 to 8, the Hall sensors 1, 2, 3, 4 are arranged alongside one another on a line. However, the Hall sensors can be arranged arbitrarily, in principle. They can be arranged in particular at the corner points of a regular polygon. The Hall sensors need not be arranged adjacent to one another, but rather can be arranged at relatively large, if appropriate also irregular, distances from one another within the same plane or else in different planes. The Hall sensors can be arranged vertically, in particular, in the semiconductor component, such that it is possible to measure magnetic field components parallel to the plane of a top side of the component, in particular parallel to a main top side at which electronic components are integrated.

The angle between the operating currents of the Hall sensors succeeding one another in the series circuit can be chosen arbitrarily. Said angles can each be of identical magnitude or instead vary among one another. The operating currents do not have to be varied in the same sense in each case in all of the Hall sensors. That applies, in particular, to the cases where the Hall sensors are permuted from phase to phase in the series circuit. An orientation of the operating currents at angles different than 90° presupposes that the Hall sensors and/or the terminals of the Hall sensors are arranged at suitable angles with respect to one another.

FIGS. 9 to 12 schematically show arrangements composed of four Hall sensors 1, 2, 3, 4, which are connected in series by means of electrically conductive connections 10, for successive phases of an operating method, in accordance with FIGS. 5 to 8. In the embodiment according to FIGS. 9 to 12, all of the Hall sensors 1, 2, 3, 4, as in the embodiment according to FIGS. 5 to 8, are provided with terminals arranged at angles of 90°, 180° and 270°. For the electrical connections in the phases illustrated, the statements corresponding to those for the embodiment according to FIGS. 5 to 8 hold true in the case of the embodiment according to FIGS. 9 to 12. In contrast to the embodiment according to FIGS. 5 to 8, in the case of the embodiment according to FIGS. 9 to 12, the second Hall sensor 2 and the fourth Hall sensor 4 are rotated by 45° relative to the first Hall sensor 1 and the third Hall sensor 3, such that the operating currents I2/I2', I4/I4' of the second Hall sensor 2 and of the fourth Hall sensor 4 can be rotated by 45°, 135°, 225° and 315°, respectively, relative to the operating currents I1/I1', I3/I3' of the first Hall sensor 1 and of the third Hall sensor 3. Instead, the Hall sensors 1, 2, 3, 4 can all be oriented identically and be provided with eight terminals, for example, the orientations of which form angles that are multiples of 45°. If each Hall sensor 1, 2, 3, 4 of the arrangement is provided with eight terminals, the method can also be carried out with eight phases of different interconnections.

Figure 13:
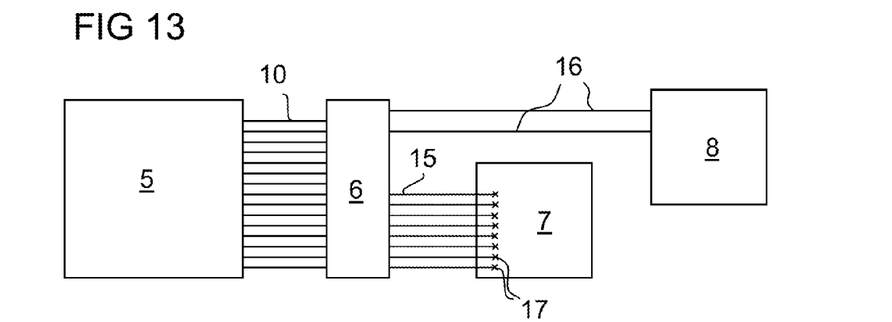
FIG. 13 shows a schematic circuit diagram of an arrangement of Hall sensors and further circuit components.

FIG. 13 shows a schematic circuit diagram of a Hall sensor arrangement 5, of a switching network 6, of a current supply unit 7 and of a measuring circuit 8. The electrically conductive connections 10 between the Hall sensor arrangement 5 and the switching network 6 are provided for suitably interconnecting the terminals provided for the series circuit of the Hall sensors and the terminals provided for tapping off the signals, in particular a Hall voltage. This circuit is changed in each operating phase, for which purpose a corresponding device, for example a multiplexer, is provided in the switching network 6. Moreover, the switching network 6 connects the Hall sensors to the corresponding terminals of a current supply unit 7, which provides the operating currents or operating voltages via corresponding connections 15. Further connections 16 lead from the switching network to the measuring circuit 8, such that the signals, in particular Hall voltages, tapped off at the respective terminals of the Hall sensor arrangement 5 can be measured.

The directions of the operating currents and the voltage tap can be set up in the different phases in particular such that the Hall voltage changes its sign between two phases that differ by 90° or 270° in the current direction. The offset is then a static signal. In this case, with the use of a chopper amplifier, the switching network 6, for example a multiplexer, can also be used for chopping the signal, in addition to the changeover of the terminal connections between the individual phases.

Figure 14:
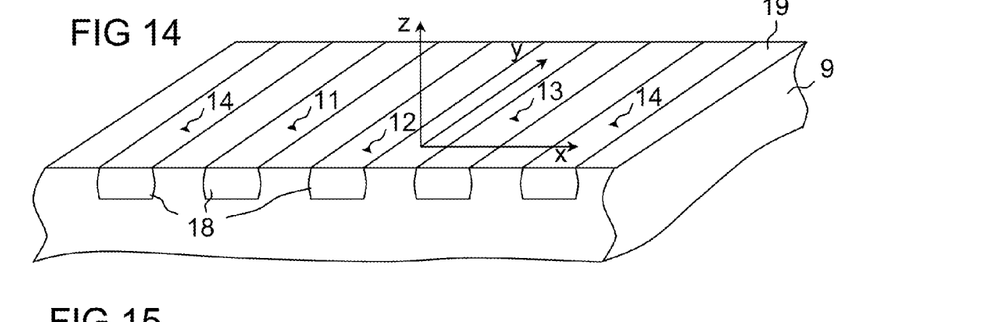
FIG. 14 shows a schematic diagram of a semiconductor component comprising vertical Hall sensors.

FIG. 14 shows a schematic illustration of a Hall sensor semiconductor component comprising a semiconductor body 9 having doped regions 18 at a substantially planar top side 19. A vertical Hall sensor is formed with the doped regions 18 and the schematically depicted terminals 11, 12, 13, 14, which vertical Hall sensor is known per se and also described in the book by R. S. Popovic cited in the introduction. With a vertical Hall sensor, it is possible to measure a magnetic field component in the plane of the top side 19, that is to say in directions formed vectorially from the depicted arrows x and y. In the component, it is possible to integrate further vertical Hall sensors and also lateral Hall sensors which can measure a magnetic field component perpendicular to the plane of the top side 19, that is to say in the direction of the arrow z. During a measurement, as described above, vertical and/or lateral Hall sensors can be interconnected differently phase by phase. Electronic components, in particular of the switching network 6, of the current supply unit 7 and of the measuring circuit 8, can be integrated at the top side 19. The semiconductor component can be produced using silicon, for example.

Figure 15:
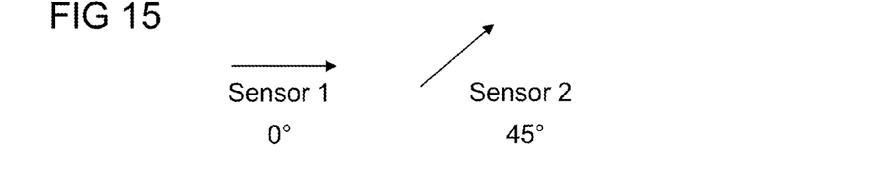
FIG. 15 shows a schematic diagram of one example of a direction arrangement of the operating currents for two Hall sensors.
Figure 16:
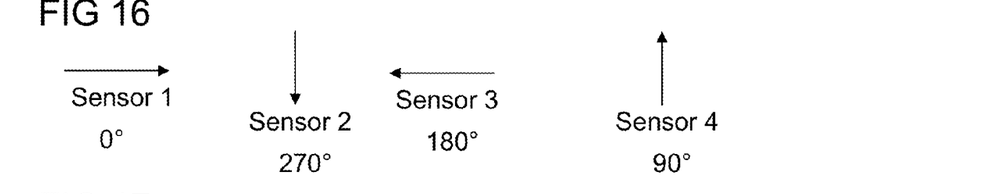
FIG. 16 shows a schematic diagram of a further example of a direction arrangement of the operating currents for four Hall sensors.
Figure 17:
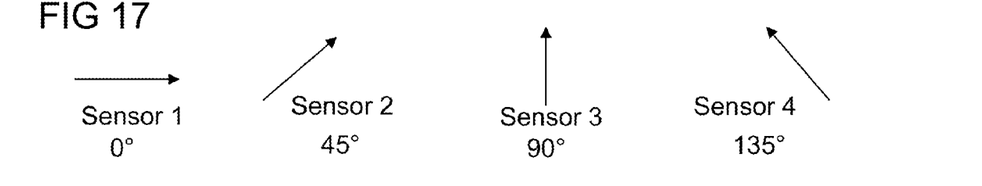
FIG. 17 shows a schematic diagram of a further example of a direction arrangement of the operating currents for four Hall sensors.
Figure 18:
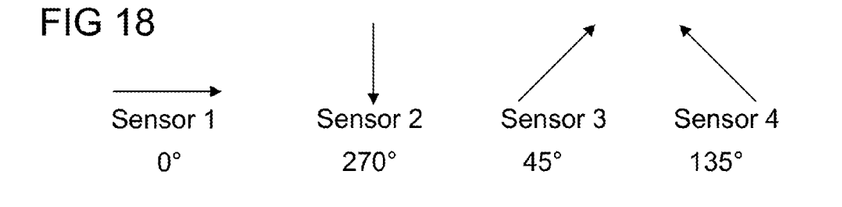
FIG. 18 shows a schematic diagram of a further example of a direction arrangement of the operating currents for four Hall sensors.

FIGS. 15 to 21 show schematic diagrams for different orientations of the operating currents with respect to one another. The operating currents and the directions thereof are reproduced in each case by an arrow as in FIGS. 1 to 12. FIGS. 16 to 18 in each case concern embodiments comprising four Hall sensors, while FIG. 15 reproduces an example comprising two sensors, FIG. 19 an example comprising three sensors, FIG. 20 an example comprising eight sensors, and FIG. 21 an example comprising 12 sensors. Indicated below the arrows in each case is the angle of the arrow measured in a mathematically positive direction of rotation in relation to the first arrow depicted on the left. The choice of the directions of the operating currents in accordance with FIG. 15 is particularly suitable in the case of an arrangement of two Hall sensors.

In the examples in FIGS. 16, 17 and 18 there are in each case two pairs of sensors whose operating currents are directed at an angle of 90° with respect to one another. In the examples in FIGS. 16 and 18, the sensors 1 and 2 form one pair and the sensors 3 and 4 form the other pair. In the example in FIG. 17, the sensors 1 and 3 form one pair and the sensors 2 and 4 form the other pair.

In the example in FIG. 16, the directions of the operating currents of the second pair of sensors are rotated by 180° relative to the first pair of sensors.

In the example in FIG. 17, the directions of the operating currents of the second pair of sensors are rotated by 45° relative to the first pair of sensors.

In the example in FIG. 18, the directions of the operating currents of the second pair of sensors are rotated by 135° relative to the first pair of sensors.

The directions of the operating currents shown in FIGS. 17 and 18 are particularly suitable in the case of an arrangement of four Hall sensors and can be used in particular in two different operating phases of an arrangement of four Hall sensors.

In the example in FIG. 15, the directions of the operating currents are rotated by 45°, that is to say by 90° divided by the number of sensors.

Figure 19:
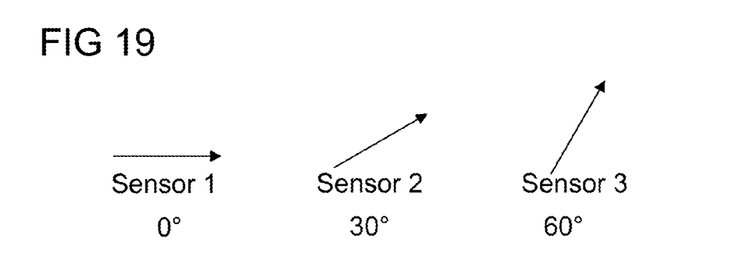
FIG. 19 shows a schematic diagram of one example of a direction arrangement of the operating currents for three Hall sensors.

In the example in FIG. 19, the directions of the operating currents in the successive Hall sensors are rotated in each case by 30°, that is to say by 90° divided by the number of sensors.

Figure 20:
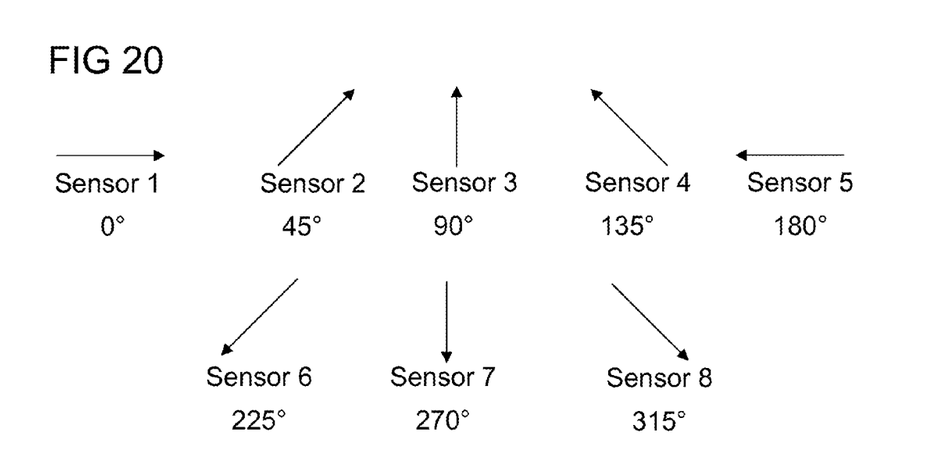
FIG. 20 shows a schematic diagram of one example of a direction arrangement of the operating currents for eight Hall sensors.

In the example in FIG. 20, the operating currents in the successive Hall sensors are rotated in each case by 45°, that is to say by 360° divided by the number of sensors.

Figure 21:
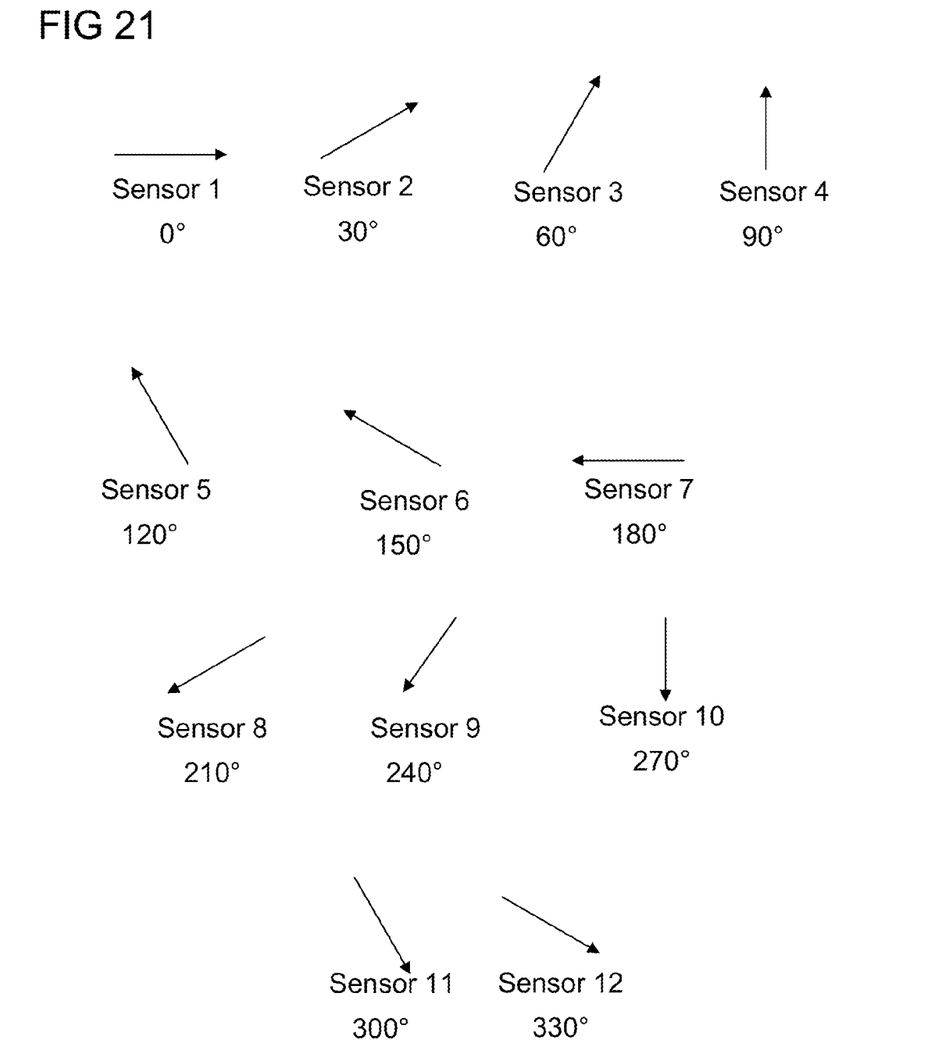
FIG. 21 shows a schematic diagram of one example of a direction arrangement of the operating currents for twelve Hall sensors.

In the example in FIG. 21, the operating currents in the successive Hall sensors are rotated with respect to one another in each case by 30°, that is to say by 360° divided by the number of sensors.

In the examples in FIGS. 17, 18 and 20, the supply terminals of the Hall sensors are connected in each of the phases such that the directions of the operating currents within two groups comprising the same number of Hall sensors form angles of 90°, 180° and/or 270° among one another, and the directions of the operating currents of two Hall sensors belonging to different ones of said groups form in each case an angle of 45°, 135°, 225° or 315°. In the case of FIG. 17, one of said groups is formed by the sensors 1 and 3 and the other of said groups is formed by the sensors 2 and 4. In the case of FIG. 18, one of said groups is formed by the sensors 1 and 2 and the other of said groups is formed by the sensors 3 and 4. In the case of FIG. 20, one of said groups is formed by the sensors 1, 3, 5 and 7 and the other of said groups is formed by the sensors 2, 4, 6 and 8.

FIGS. 15 to 21 show that the directions of the operating currents in the Hall sensors are different in one circuit phase. The directions of the operating currents of the Hall sensors are changed in the successive circuit phases. In this case, by way of example, the angles between the directions of the operating currents in the Hall sensors succeeding one another in accordance with the series circuit can remain the same. The arrow diagrams in FIGS. 15 to 21 remain the same in this case apart from a cyclic permutation of the arrows. Instead, the angles between the directions of the operating currents in the Hall sensors that succeed one another in accordance with the series circuit can also vary from phase to phase.

Figure 22:
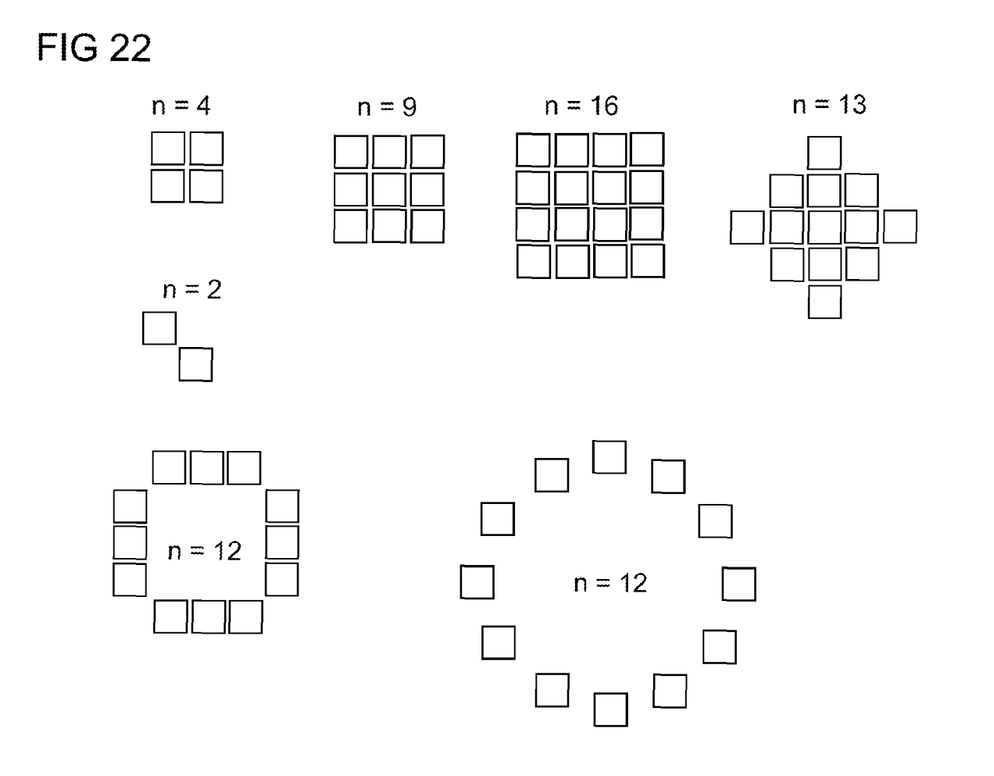
FIG. 22 shows different schematic diagrams of arrangements composed of two to sixteen Hall sensors.

FIG. 22 shows schematic illustrations of typical arrangements of 2, 4, 9, 12, 13 and 16 Hall sensors within a plane. The Hall sensors are represented by squares. The directions of the operating currents are horizontal or vertical or else diagonal, depending on the arrangement of the terminals of the Hall sensors. In the examples illustrated, the arrangements are in each case symmetrical with respect to a rotation by 90° about an axis which is perpendicular to the plane of the arrangement and which runs through the center of the relevant arrangement. A symmetrical Hall sensor arrangement is particularly suitable for eliminating the undesirable offset voltage.

The diagonal arrangement shown for two Hall sensors in FIG. 22 can be particularly suitable if only two different phases are used.

Figure 9:
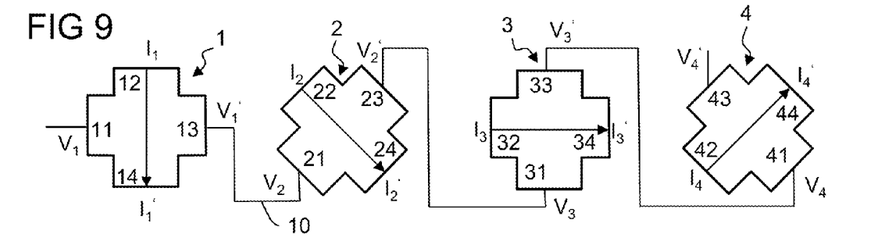
FIG. 9 shows a schematic illustration of a further arrangement composed of two Hall sensors.
Figure 10:
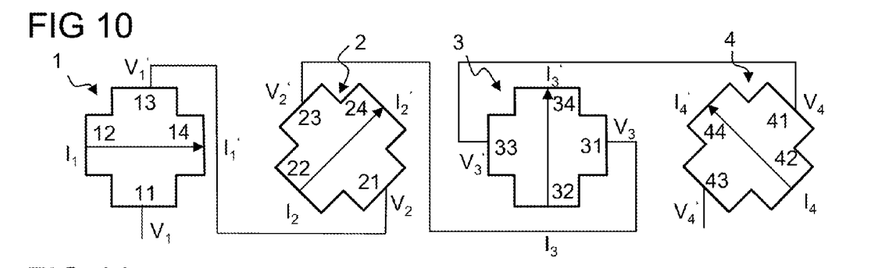
FIG. 10 shows the arrangement in accordance with FIG. 9 for a subsequent circuit phase.
Figure 11:
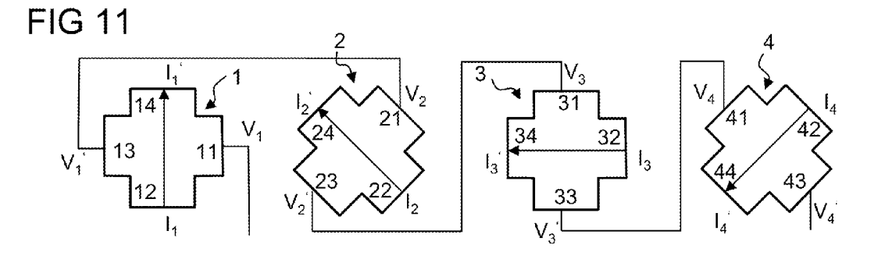
FIG. 11 shows the arrangement in accordance with FIG. 10 for a subsequent circuit phase.
Figure 12:
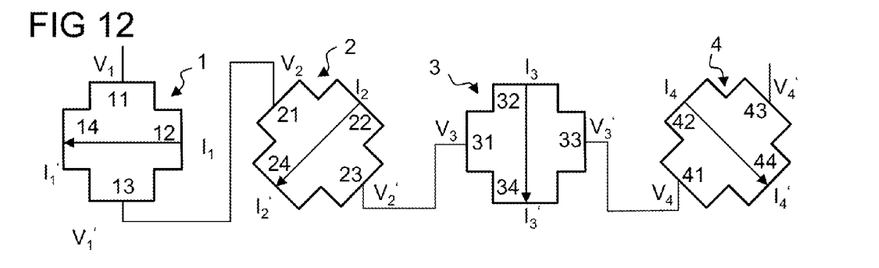
FIG. 12 shows the arrangement in accordance with FIG. 11 for a subsequent circuit phase.
Figure 23:
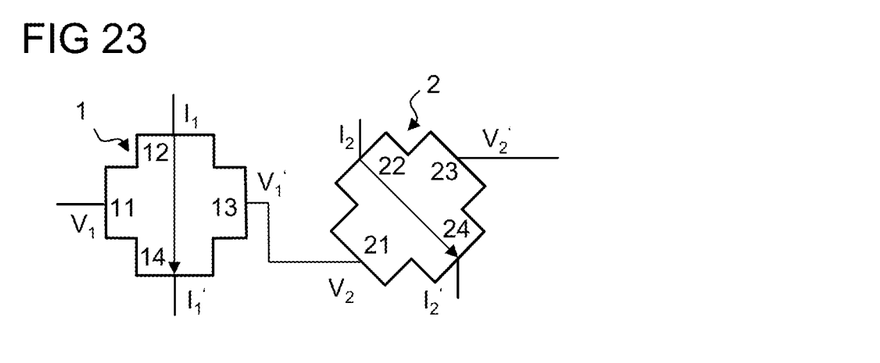
FIG. 23 shows an arrangement composed of two Hall sensors for a first operating mode.

FIG. 23 shows an arrangement composed of two Hall sensors 1, 2 arranged at an angle of 45° with respect to one another, for example the Hall sensors 1 and 2 from FIG. 9. The directions of the operating currents I1/I1', I2/I2' likewise form an angle of 45° in the phase illustrated. In the operating mode illustrated, respectively separate current sources I1, I2 and current sinks I1', I2' are present for the operating currents I1/I1', I2/I2'.

Figure 24:
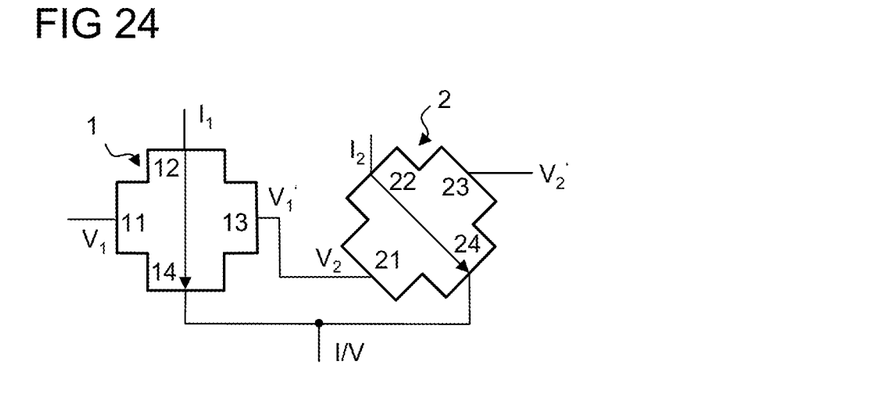
FIG. 24 shows an arrangement composed of two Hall sensors in accordance with FIG. 23 for a second operating mode.

FIG. 24 shows the arrangement in accordance with FIG. 23 for a different operating mode, in which a current source or current sink I common to the Hall sensors 1, 2 or a common voltage terminal V is present. The circuit complexity is thereby simplified in comparison with the embodiment in accordance with FIG. 23, but the achieved sensitivity of the Hall sensor semiconductor component is greater than in the case of an individual sensor.

Figure 25:
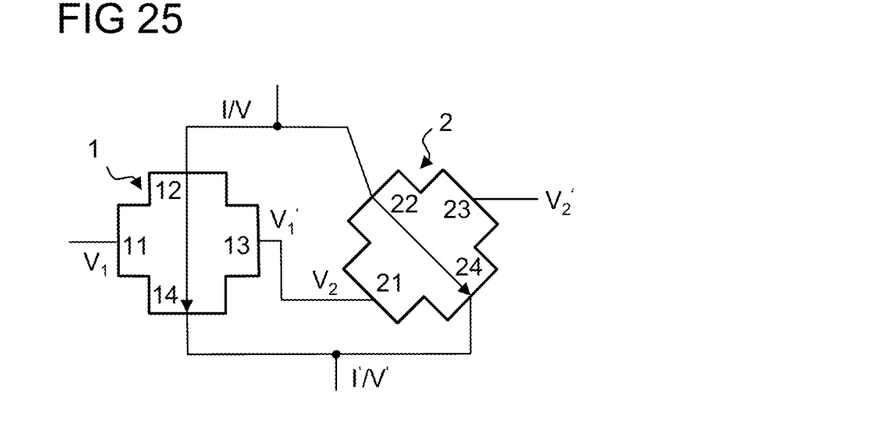
FIG. 25 shows an arrangement composed of two Hall sensors in accordance with FIG. 24 for a third operating mode.

FIG. 25 shows the arrangement in accordance with FIG. 23 for an operating mode in which there are provided, common to the two Hall sensors 1, 2, current sources I and current sinks I', voltage terminals V, V' or a combination of a current source I and respectively of a current sink I' with a voltage terminal V, V'. The circuitry interconnection can therefore be effected as in the case of an individual Hall sensor. The arrangement corresponds to a non-rotationally symmetrical Hall sensor which, in contrast to conventional asymmetrical Hall sensors, is equipped with the possibility of using the spinning current technique. As a result of the series circuit formed by the signal terminals, the achieved sensitivity of the Hall sensor semiconductor component is significantly greater than in the case of an individual sensor. In this embodiment, the Hall sensor semiconductor component can be operated with a constant operating voltage, such that there is no need for supply using constant-current sources.

Figure 26:
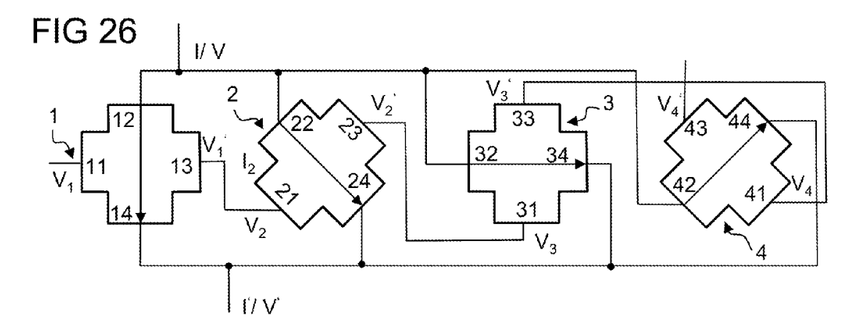
FIG. 26 shows an arrangement composed of four Hall sensor for an operating mode in accordance with FIG. 25.

FIG. 26 shows a further embodiment composed of four Hall sensors 1, 2, 3, 4 oriented as in the embodiment in FIGS. 9 to 12. The circuit corresponds to the operating mode in accordance with FIG. 25, in which there are provided, common to the Hall sensors 1, 2, 3, 4 current sources I and current sinks I', voltage terminals V, V' or a combination of a current source I and respectively of a current sink I' with a voltage terminal V, V'. This arrangement likewise corresponds to a non-rotationally symmetrical Hall sensor which, in contrast to conventional asymmetrical Hall sensors, is equipped with the possibility of using the spinning current technique.

With the switching network 6, current sources that supply the operating currents can be permuted without difficulty. It is particularly advantageous if in each case with respect to an operating phase a further operating phase is provided, in which the direction of the operating current in each Hall sensor is reversed, that is to say that the operating current has the opposite orientation. That will be explained with reference to FIGS. 27 and 28.

Figure 27:
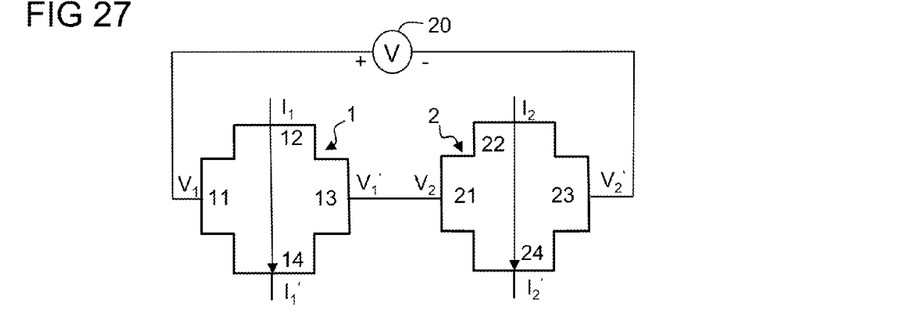
FIG. 27 shows a schematic circuit diagram for two Hall sensors for a first direction of the operating currents.

FIG. 27 shows a circuit diagram for an arrangement composed of two Hall sensors 1, 2 with the circuit—associated with one phase—of the supply terminals 12, 14, 22, 24 and the signal terminals 11, 13, 21, 23, such that the Hall sensors are connected in series via the signal terminals 11, 13, 21, 23. For the operating currents I1/I1', I2/I2', current sources I1, I2 and current sinks I1', I2' are provided in the circuit.

Figure 28:
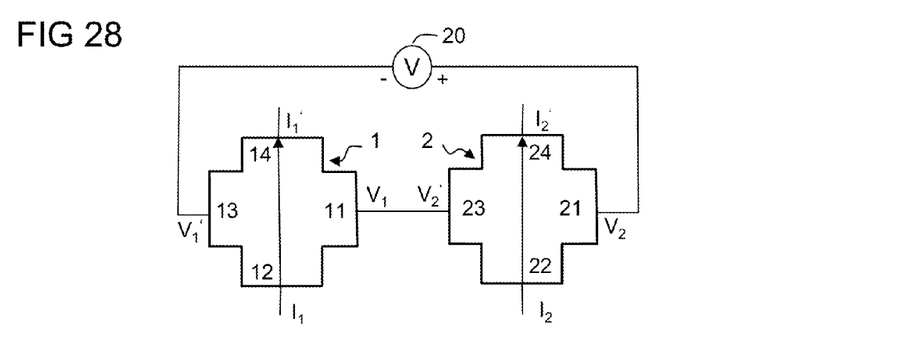
FIG. 28 shows the schematic circuit diagram in accordance with FIG. 27 for an opposite second direction of the operating currents.

FIG. 28 shows a circuit diagram in accordance with FIG. 27 for an operating phase of the same arrangement of Hall sensors 1, 2 in which the current sources I1, I2 and current sinks I1', I2' of the operating currents I1/I1', I2/I2' are interchanged relative to the phase in accordance with FIG. 27. On account of the current directions rotated by 180°, a Hall voltage that occurs has a reverse polarity, which is identified in FIGS. 27 and 28 by the depicted signs + and − of the voltmeter 20.

The operating method described is suitable for using the spinning current technique in two, four, eight or generally 2n (n is a natural number) phases if a sufficient number of terminals are provided at the Hall sensors. The Hall sensors can be identical, identical in pairs, or else different. If different sensors are provided, the sensors can be individually optimized with regard to the specific direction of the operating current and/or the dimensions.

LIST OF REFERENCE SIGNS

1 First Hall sensor
2 Second Hall sensor
3 Third Hall sensor
4 Fourth Hall sensor
5 Hall sensor arrangement
6 Switching network
7 Current supply unit 8 Measuring circuit
9 Semiconductor body
10 Connection
11 Signal terminal
12 Supply terminal
13 Signal terminal
14 Supply terminal
15 Connection
16 Connection
17 Current source/current sink
18 Doped region
19 Top side of the semiconductor body
20 Voltmeter
21 Signal terminal
22 Supply terminal
23 Signal terminal
24 Supply terminal
31 Signal terminal
32 Supply terminal
33 Signal terminal
34 Supply terminal
41 Signal terminal
42 Supply terminal
43 Signal terminal
44 Supply terminal
I Current source
I' Current sink
In Current source
In' Current sink
V Voltage terminal
V' Voltage terminal
Vn Voltage
Vn' Voltage

What is claimed is:

1. A Hall sensor semiconductor component comprising:
an arrangement composed of at least two Hall sensors each having four terminals; and
a switching network, which is provided for interconnecting the terminals for phases of the operation of the Hall sensor semiconductor component in each case in such a way that in each case two of the four terminals of each of the Hall sensors are supply terminals for operating currents flowing within the Hall sensors and the other two terminals are in each case signal terminals for tapping off a Hall voltage, wherein this interconnection varies in successive phases, and
wherein the switching network is embodied in such a way that it connects all the signal terminals in series in each of the phases, such that Hall voltages occurring in the Hall sensors are added and a summation signal can be measured at the respective outer signal terminals of the series circuit.

2. A Hall sensor semiconductor component comprising:
an arrangement composed of at least two Hall sensors each having four terminals; and
a switching network, which is provided for interconnecting the terminals for phases of the operation of the Hall sensor semiconductor component in each case in such a way that in each case two of the four terminals of each of the Hall sensors are supply terminals for operating currents flowing within the Hall sensors and the other two terminals are in each case signal terminals for tapping off a Hall voltage, wherein this interconnection varies in successive phases, and
wherein the switching network is embodied in such a way that it connects the respective signal terminals in series in each of the phases, such that Hall voltages occurring in the Hall sensors are connected in series and thus added to a summation signal, and the summation signal can be measured at the respective outer signal terminals of the series circuit.

3. A Hall sensor semiconductor component comprising:
an arrangement composed of at least two Hall sensors each having four terminals; and
a switching network, which is provided for interconnecting the terminals for phases of the operation of the Hall sensor semiconductor component in each case in such a way that in each case two of the four terminals of each of the Hall sensors are supply terminals for operating currents flowing within the Hall sensors and the other two terminals are in each case signal terminals for tapping off a Hall voltage, wherein this interconnection varies in successive phases, and
wherein the switching network is embodied in such a way that it connects the Hall sensors in series, in each of the phases, by a series connection of all the signal terminals, such that Hall voltages occurring in the Hall sensors are added and a summation signal can be measured at the respective outer signal terminals of the series circuit.

4. The Hall sensor semiconductor component according to one of claims 1, 2 or 3, wherein the Hall sensors are arranged in a semiconductor body having a top side and are oriented such that, during the operation of the Hall sensor semiconductor component, a magnetic field component parallel to the top side generates a Hall voltage.

5. The Hall sensor semiconductor component according to one of claims 1, 2 or 3, wherein a current supply unit is provided, which provides current sources and current, and
wherein provision is made of mutually separate connections between the switching network and the current supply unit for connecting the current sources and current sinks to the supply terminals.

6. The Hall sensor semiconductor component according to one of claims 1, 2 or 3, wherein the supply terminals of the Hall sensors are provided for an inflow and an outflow of the operating currents, and
wherein the switching network connects the supply terminals provided for the inflow and/or the supply terminals provided for the outflow to one another in each of the phases.

7. The Hall sensor semiconductor component according to one of claims 1, 2 or 3, wherein at least one of the Hall sensors consists of a hardwired circuit formed by a plurality of individual Hall sensors.

8. The Hall sensor semiconductor component according to one of claims 1, 2 or 3, wherein those terminals of the Hall sensors which are in each case connected as supply terminals are arranged in each of the phases such that they determine directions of the operating currents flowing within the Hall sensors which also form angles of 45°, 135°, 225° and/or 315° among one another.

9. A method for operating a Hall sensor semiconductor component according to one of claims 1, 2 or 3, wherein those terminals of the Hall sensors which are in each case connected as supply terminals are arranged in each of the phases such that they determine directions of the operating currents flowing within the Hall sensors which are different in each case in two Hall sensors connected to one another successively via signal terminals in accordance with the series circuit.

10. The method according to claim 9, wherein an even number of Hall sensors is used, and
wherein those terminals of the Hall sensors which are in each case connected as supply terminals are arranged in each of the phases such that they determine directions of the operating currents flowing within the Hall sensors in such a way that the directions of the operating currents flowing within one half of the Hall sensors form angles of 90°, 180° and/or 270° among one another and form in each case an angle of 45°, 135°, 225° or 315° with respect to the directions of the operating currents flowing within the remaining Hall sensors.

11. The method according to claim 9, wherein with respect to each phase an earlier or a later phase takes place, in which the same terminals of the Hall sensors are used as supply terminals and in each Hall sensor the direction of the operating current is reversed.

12. The method according to claim 9, wherein the sequence of the Hall sensors within the series circuit formed by the signal terminals is changed from phase to phase.

13. The method according to claim 9, wherein current sources and current sinks are provided for the operating currents and a phase takes place in which the connection of the current sources and current sinks to the same supply terminals is permuted relative to an earlier phase.

* * * * *